(12) United States Patent
Jacobs, II et al.

(10) Patent No.: US 10,229,679 B1
(45) Date of Patent: *Mar. 12, 2019

(54) NATURAL LANGUAGE USER INTERFACE FOR COMPUTER-AIDED DESIGN SYSTEMS

(71) Applicant: Benko, LLC, New London, NH (US)

(72) Inventors: James L. Jacobs, II, Amherst, NH (US); John E. Cronin, Bonita Springs, FL (US); Christopher M. Huffines, Williston, VT (US)

(*) Notice: Subject to any disclaimer, the term of this patent is extended or adjusted under 35 U.S.C. 154(b) by 70 days.

This patent is subject to a terminal disclaimer.

(21) Appl. No.: 15/388,940

(22) Filed: Dec. 22, 2016

Related U.S. Application Data

(63) Continuation of application No. 14/486,550, filed on Sep. 15, 2014, now Pat. No. 9,613,020.

(51) Int. Cl.
*G01L 15/00* (2006.01)
*G10L 15/22* (2006.01)
(Continued)

(52) U.S. Cl.
CPC .............. *G10L 15/22* (2013.01); *G06F 17/50* (2013.01); *G10L 15/1815* (2013.01);
(Continued)

(58) Field of Classification Search
CPC ......... G10L 15/00; G10L 15/22; G10L 15/26; G10L 15/265; G05B 9/4093;
(Continued)

(56) References Cited

U.S. PATENT DOCUMENTS 4,495,559 A   1/1985 Gelatt, Jr. et al.
5,117,354 A   5/1992 Long
(Continued)

FOREIGN PATENT DOCUMENTS

CN      2112190 U    8/1992
WO       154476 A2   8/2001
(Continued)

OTHER PUBLICATIONS

Xue, S., X. Y. Kou, and S. T. Tan. "Natural voice-enabled CAD: modeling via natural discourse." Computer-Aided Design and Applications 6.1 (2009): 125-136.*
Kou, X. Y., S. K. Xue, and S. T. Tan. "Knowledge-guided inference for voice-enabled CAD." Computer-Aided Design 42.6 (2010): 545-557.*
(Continued)

*Primary Examiner* — Paras D Shah
(74) *Attorney, Agent, or Firm* — Caldwell Intellectual Property

(57) ABSTRACT

A natural language user interface for computer-aided design systems (CAD) comprises a natural language command module including a parser, language database and a CAD model analyzer, and a natural language server module including a second, increased capability parser, a second, preferably larger language database and a CAD context database. The CAD model analyzer analyzes and retrieves associated CAD model information related to a parsed voice command and the CAD context database provides specific CAD related contextual information to facilitate parsing and interpreting CAD specific commands. The natural language server program module may also include an artificial intelligence based query generator and communicate through a network or cloud with resource providers such as third party market places or suppliers to generate queries for retrieval of third party supplied information necessary to respond to or execute CAD specific voice commands.

1 Claim, 8 Drawing Sheets

(51) Int. Cl.
  *G10L 15/18* (2013.01)
  *G06F 17/50* (2006.01)
  *G06F 3/0481* (2013.01)

(52) U.S. Cl.
  CPC ........ *G10L 15/1822* (2013.01); *G06F 3/0481* (2013.01); *G10L 2015/223* (2013.01)

(58) Field of Classification Search
  CPC .............. G05B 9/4099; G05B 9/40931; G05B 9/40932; G05B 9/40933; G05B 9/40935; G05B 9/40936; G05B 9/40938; G05B 9/4097; G05B 2219/13139; G05B 2219/23005; G05B 2219/23007; G05B 2219/23011; G05B 2219/23012
  USPC ...................... 704/275; 700/182, 98; 715/964
  See application file for complete search history.

(56) References Cited

U.S. PATENT DOCUMENTS

| | | | |
|---|---|---|---|
| 5,465,221 A | 11/1995 | Merat et al. | |
| 5,495,430 A | 2/1996 | Matsunari et al. | |
| 5,552,995 A | 9/1996 | Sebastian | |
| 5,570,291 A | 10/1996 | Dudle et al. | |
| 5,655,087 A | 8/1997 | Hino et al. | |
| 5,758,328 A | 5/1998 | Giovannoli | |
| 5,847,971 A | 12/1998 | Ladner et al. | |
| 5,870,719 A | 2/1999 | Maritzen et al. | |
| 5,937,189 A | 8/1999 | Branson et al. | |
| 6,031,535 A | 2/2000 | Barton | |
| 6,112,133 A | 8/2000 | Fishman | |
| 6,295,513 B1 | 9/2001 | Thackston | |
| 6,341,271 B1 | 1/2002 | Salvo et al. | |
| 6,343,285 B1 | 1/2002 | Tanaka et al. | |
| 6,611,725 B1* | 8/2003 | Harrison | G06T 19/00 345/420 |
| 6,647,373 B1 | 11/2003 | Carlton-Foss | |
| 6,701,200 B1 | 3/2004 | Lukis et al. | |
| 6,750,864 B1 | 6/2004 | Anwar | |
| 6,834,312 B2 | 12/2004 | Edwards et al. | |
| 6,836,699 B2 | 12/2004 | Lukis et al. | |
| 6,859,768 B1 | 2/2005 | Wakelam et al. | |
| 6,922,701 B1 | 6/2005 | Ananian et al. | |
| 6,917,847 B2 | 7/2005 | Littlejohn et al. | |
| 7,006,084 B1 | 2/2006 | Buss et al. | |
| 7,058,465 B2 | 6/2006 | Emori et al. | |
| 7,079,990 B2 | 7/2006 | Haller et al. | |
| 7,085,687 B2 | 8/2006 | Eckenwiler et al. | |
| 7,089,082 B1 | 8/2006 | Lukis et al. | |
| 7,123,986 B2 | 10/2006 | Lukis et al. | |
| 7,134,096 B2 | 11/2006 | Brathwaite et al. | |
| 7,299,101 B2 | 11/2007 | Lukis et al. | |
| 7,305,367 B1 | 12/2007 | Hollis et al. | |
| 7,327,869 B2 | 2/2008 | Boyer | |
| 7,343,212 B1 | 3/2008 | Brearley et al. | |
| 7,359,886 B2 | 4/2008 | Sakurai et al. | |
| 7,366,643 B2 | 4/2008 | Verdura et al. | |
| 7,369,970 B2 | 5/2008 | Shimizu et al. | |
| 7,418,307 B2 | 8/2008 | Katircioglu | |
| 7,467,074 B2 | 12/2008 | Faruque et al. | |
| 7,496,487 B2 | 2/2009 | Wakelam et al. | |
| 7,496,528 B2 | 2/2009 | Lukis et al. | |
| 7,499,871 B1 | 3/2009 | McBrayer et al. | |
| 7,523,411 B2 | 4/2009 | Carlin | |
| 7,526,358 B2 | 4/2009 | Kawano et al. | |
| 7,529,650 B2 | 5/2009 | Wakelam et al. | |
| 7,565,139 B2 | 7/2009 | Neven, Sr. et al. | |
| 7,565,223 B2 | 7/2009 | Moldenhauer et al. | |
| 7,567,849 B1 | 7/2009 | Trammell et al. | |
| 7,568,155 B1 | 7/2009 | Axe et al. | |
| 7,571,166 B1 | 8/2009 | Davies et al. | |
| 7,574,339 B2 | 8/2009 | Lukis et al. | |
| 7,590,466 B2 | 9/2009 | Lukis et al. | |
| 7,590,565 B2 | 9/2009 | Ward et al. | |
| 7,603,191 B2 | 10/2009 | Gross | |
| 7,606,628 B2 | 10/2009 | Azuma | |
| 7,630,783 B2 | 12/2009 | Walls-Manning et al. | |
| 7,656,402 B2 | 2/2010 | Abraham et al. | |
| 7,689,936 B2 | 3/2010 | Rosel | |
| 7,733,339 B2 | 6/2010 | Laning et al. | |
| 7,747,469 B2 | 6/2010 | Hinman | |
| 7,748,622 B2 | 7/2010 | Schon et al. | |
| 7,761,319 B2 | 7/2010 | Gil et al. | |
| 7,822,682 B2 | 10/2010 | Arnold et al. | |
| 7,836,573 B2 | 11/2010 | Lukis et al. | |
| 7,840,443 B2 | 11/2010 | Lukis et al. | |
| 7,908,200 B2 | 3/2011 | Scott et al. | |
| 7,957,830 B2 | 6/2011 | Lukis et al. | |
| 7,979,313 B1 | 7/2011 | Baar | |
| 7,993,140 B2 | 8/2011 | Sakezles | |
| 8,000,987 B2 | 8/2011 | Hickey et al. | |
| 8,024,207 B2 | 9/2011 | Ouimet | |
| 8,140,401 B2 | 3/2012 | Lukis et al. | |
| 8,170,946 B2 | 5/2012 | Blair et al. | |
| 8,175,933 B2 | 5/2012 | Cook, Jr. et al. | |
| 8,180,396 B2 | 5/2012 | Athsani et al. | |
| 8,209,327 B2 | 6/2012 | Danish et al. | |
| 8,239,284 B2 | 8/2012 | Lukis et al. | |
| 8,249,329 B2 | 8/2012 | Silver | |
| 8,271,118 B2 | 9/2012 | Pietsch et al. | |
| 8,275,583 B2 | 9/2012 | Devarajan et al. | |
| 8,295,971 B2 | 10/2012 | Krantz | |
| 8,417,478 B2 | 4/2013 | Gintis et al. | |
| 8,441,502 B2 | 5/2013 | Reghetti et al. | |
| 8,515,820 B2 | 8/2013 | Lopez et al. | |
| 8,554,250 B2 | 10/2013 | Linaker | |
| 8,571,298 B2 | 10/2013 | McQueen et al. | |
| 8,595,171 B2 | 11/2013 | Qu | |
| 8,700,185 B2 | 4/2014 | Yucel et al. | |
| 8,706,607 B2 | 4/2014 | Sheth et al. | |
| 8,768,651 B2 | 7/2014 | Bhaskaran et al. | |
| 8,798,324 B2 | 8/2014 | Conradt | |
| 8,806,398 B2 | 8/2014 | Brathwaite et al. | |
| 8,830,267 B2 | 9/2014 | Brackney | |
| 8,849,636 B2 | 9/2014 | Becker et al. | |
| 8,861,005 B2 | 10/2014 | Grosz | |
| 8,874,413 B2 | 10/2014 | Mulligan et al. | |
| 8,923,650 B2 | 12/2014 | Wexler | |
| 8,977,558 B2 | 3/2015 | Nielsen et al. | |
| 9,037,692 B2 | 5/2015 | Ferris | |
| 9,055,120 B1 | 6/2015 | Firman | |
| 9,106,764 B2 | 8/2015 | Chan et al. | |
| 2001/0023418 A1 | 9/2001 | Suzuki et al. | |
| 2001/0047251 A1* | 11/2001 | Kemp | G06F 17/5004 703/1 |
| 2002/0065790 A1 | 5/2002 | Oouchi | |
| 2002/0087440 A1 | 7/2002 | Blair et al. | |
| 2002/0099579 A1 | 7/2002 | Stowell et al. | |
| 2002/0107673 A1 | 8/2002 | Haller et al. | |
| 2002/0152133 A1 | 10/2002 | King et al. | |
| 2003/0018490 A1 | 1/2003 | Magers et al. | |
| 2003/0069824 A1 | 4/2003 | Menninger | |
| 2003/0078846 A1 | 4/2003 | Burk et al. | |
| 2003/0139995 A1 | 7/2003 | Farley | |
| 2003/0149500 A1 | 8/2003 | Faruque et al. | |
| 2003/0163212 A1 | 8/2003 | Smith et al. | |
| 2003/0172008 A1 | 9/2003 | Hage et al. | |
| 2003/0212610 A1 | 11/2003 | Duffy et al. | |
| 2003/0220911 A1* | 11/2003 | Tompras | G06F 17/50 |
| 2004/0008876 A1* | 1/2004 | Lure | G06F 19/3406 382/128 |
| 2004/0113945 A1 | 6/2004 | Park et al. | |
| 2004/0195224 A1 | 10/2004 | Kanodia et al. | |
| 2005/0055299 A1 | 3/2005 | Chambers et al. | |
| 2005/0125092 A1 | 6/2005 | Lukis et al. | |
| 2005/0144033 A1 | 6/2005 | Vreeke et al. | |
| 2005/0171790 A1 | 8/2005 | Blackmon | |
| 2005/0251478 A1 | 11/2005 | Yanavi | |
| 2005/0273401 A1 | 12/2005 | Yeh et al. | |
| 2006/0085322 A1 | 4/2006 | Crookshanks | |
| 2006/0185275 A1 | 8/2006 | Yatt | |
| 2006/0253214 A1 | 11/2006 | Gross | |
| 2007/0016437 A1 | 1/2007 | Elmufdi et al. | |

(56) References Cited

U.S. PATENT DOCUMENTS

| | | |
|---|---|---|
| 2007/0067146 A1 | 3/2007 | Devarajan et al. |
| 2007/0073593 A1 | 3/2007 | Perry et al. |
| 2007/0112635 A1 | 5/2007 | Loncaric |
| 2007/0198231 A1 | 8/2007 | Walch |
| 2008/0120086 A1 | 5/2008 | Lilley et al. |
| 2008/0183614 A1 | 7/2008 | Gujral et al. |
| 2008/0269942 A1 | 10/2008 | Free |
| 2008/0281678 A1 | 11/2008 | Keuls et al. |
| 2009/0058860 A1 | 3/2009 | Fong et al. |
| 2009/0208773 A1 | 8/2009 | DuPont |
| 2009/0299799 A1 | 12/2009 | Racho et al. |
| 2009/0319388 A1 | 12/2009 | Yuan et al. |
| 2011/0040542 A1 | 2/2011 | Sendhoff et al. |
| 2011/0047140 A1 | 2/2011 | Free |
| 2011/0209081 A1 | 8/2011 | Chen et al. |
| 2011/0213757 A1 | 9/2011 | Bhaskaran et al. |
| 2012/0016678 A1 | 1/2012 | Gruber et al. |
| 2012/0072299 A1 | 3/2012 | Sampsell |
| 2012/0230548 A1 | 9/2012 | Calman et al. |
| 2012/0316667 A1 | 12/2012 | Hartloff |
| 2013/0055126 A1* | 2/2013 | Jackson ............. G06F 3/04812 715/769 |
| 2013/0097259 A1 | 4/2013 | Li |
| 2013/0100128 A1 | 4/2013 | Steedly et al. |
| 2013/0138529 A1 | 5/2013 | Hou |
| 2013/0144566 A1 | 6/2013 | De Biswas |
| 2013/0166470 A1 | 6/2013 | Grala et al. |
| 2013/0218961 A1 | 8/2013 | Ho |
| 2013/0293580 A1 | 11/2013 | Spivack |
| 2013/0297320 A1* | 11/2013 | Buser ................. B29C 67/0055 704/275 |
| 2013/0297460 A1 | 11/2013 | Spivack |
| 2013/0311914 A1* | 11/2013 | Daily ........................ G06F 8/38 715/763 |
| 2013/0325410 A1 | 12/2013 | Jung et al. |
| 2014/0042136 A1 | 2/2014 | Daniel et al. |
| 2014/0067333 A1 | 3/2014 | Rodney et al. |
| 2014/0075342 A1 | 3/2014 | Corlett |
| 2014/0098094 A1 | 4/2014 | Neumann et al. |
| 2014/0157579 A1 | 6/2014 | Chhabra et al. |
| 2014/0207605 A1 | 7/2014 | Allin et al. |
| 2014/0229316 A1 | 8/2014 | Brandon |
| 2014/0279177 A1 | 9/2014 | Stump |
| 2014/0379119 A1 | 12/2014 | Sciacchitano et al. |
| 2015/0055085 A1 | 2/2015 | Fonte et al. |
| 2015/0066189 A1 | 3/2015 | Mulligan et al. |
| 2015/0127480 A1 | 5/2015 | Herrman et al. |
| 2015/0234377 A1 | 8/2015 | Mizikovsky |

FOREIGN PATENT DOCUMENTS

| | | |
|---|---|---|
| WO | 171626 A2 | 9/2001 |
| WO | 2001077781 A2 | 10/2001 |
| WO | 2006086332 A2 | 8/2006 |
| WO | 2007067248 A2 | 6/2007 |
| WO | 2011139630 A1 | 11/2011 |
| WO | 2011140646 | 11/2011 |
| WO | 2013058764 A1 | 4/2013 |
| WO | 2014152396 A2 | 9/2014 |

OTHER PUBLICATIONS

Sharma, Anirudh, et al. "MozArt: a multimodal interface for conceptual 3D modeling." Proceedings of the 13th international conference on multimodal interfaces. ACM, 2011.*

Defining Lead Time for APS Planning; http://t3.apptrix.com/syteline/Language/en-US/Other/Process/Defining_Lead_Time.htm [online][retrieved Mar. 31, 2017].

"Quartiles." Mathisfun.com. Web. <https://www.mathsisfun.com/data/quartiles.html>. Archive. <https://web.archive.org/web/20170313183511/https://www.mathsisfun.com/data/quartiles.html> [online] [retrieved Mar. 31, 2017].

Wu et al. Interactive 3D Geometric Modelers with 2D UI, 2002, State University of Campinas, www.dca.fee.unicamp.br, Sao Paulo, Brazil; 2002, 8 pages.

"Upload Your Photos, Print a 3D Model with hypr3D." SolidSmack. http://www.solidsmack.com/cad-design-news/hypr3d-photo-video-3d-print/; last accessed on Oct. 13, 2015.

"123D Catch." Autodesk. http://apps.123dapp.com/catch/ [online] [retrieved Mar. 31, 2017].

Rothganger et al. "3D Object Modeling and Recognition from Photographs and Image Sequences." Toward Category-Level Object Recognition. 2006, pp. 105-126, vol. 4170 of the series Lecture Notes in Computer Science. Springer Berlin Heidelberg.

Dealer Information Systems Corporation. "Parts Inventory." http://dis-corp.com/content/agriculture/inventory/parts-inventory. [online] [retrieved Mar. 31, 2017].

EMachineShop. "Emachineshop Features." http://www.emachineshop.com/machine-shop/Features/page518.html. [online] [retrieved Mar. 31, 2017].

Retrieved from:http://www.solidworks.com/sw/products/3d-cad/manufacturing-cost-estimation-quoting.htm p. 1: Automatic Manufacturing Cost Estimation Overview; Solidworks; 2015.

Retrieved from: http://www.gom.com/fileadmin/user_upload/industries/touch_probe_fixtures_EN.pdf; Application Example: Quality Control, Online Calibration and Validation of Fixtures, Jigs and Gauges. GOM mbH, 2008.

http://citeseerx.ist.psu.edu/viewdoc/download?doi=10.1.1.194.7785&rep=rep1&type=pdf Kim, Jin Baek, and Arie Segev. "A web services-enabled marketplace architecture for negotiation process management." Decision Support Systems 40.1 (2005): 71-87.

Jaiswal, Ashutosh et al., "Design and Implementation of a Secure Multi-Agent Marketplace", Elsevier Science, pp. 1-23, Jun. 3, 2004; http://magnet.cs.umn.edu/papers/Jaiswal04cera.pdf.

http://www.computer.org/csdl/proceedings/hicss/2005/2268/01/22680038.pdf Bui, Tung, and Alexandre Gachet. "Web services for negotiation and bargaining in electronic markets: Design requirements and implementation framework." System Sciences, 2005. HICSS'05. Proceedings of the 38th Annual Hawaii International Conference on. IEEE, 2005.

http://www.bridgelinedigital.com/File%20Library/Repository/eCommerce/Sample-eCommerce-RFP-Template_Bridgeline-Digital.pdf. Sample RFP Template: Ecommerce Platform, Bridgeline Digital, 2014.

Matchbook, Tealbook, http://www.matchbookinc.com/ Sep. 28, 2015.

3Diligent, Source Smarter, http://www.3diligent.com/customer.html; Sep. 28, 2015.

Dassault Systemes, Brochure, Mar. 24, 2010: New Features Type3ToCatia http://www.type3.us/content/download/2202/405535/file/New%20Feature_Type3ToCatia_2010_US%20old.pdf.

Sorpas ("User Manual,", Swanted Software and Engineering Aps, 2011 (120 pages)).

Kalpakjian, S. and Schmid, S., *Manufacturing Processes for Engineering Materials*, 5$^{th}$ Ed. Pearson (Jul. 27, 2007).

Wang and Bourne, *Design and Manufacturing of Sheet Metal Parts: Using Features to Aid Process Planning and Resolve Manufacturability Problems*, Robotics and Computer-Integrated Manufacturing, vol. 13, No. 3, pp. 281-294 (1997).

U.S. Appl. No. 14/267,447, Aug. 5, 2015, Office Action.
U.S. Appl. No. 14/197,922, Nov. 26, 2014, Office Action.
U.S. Appl. No. 14/197,922, Apr. 27, 2015, Response to Office Action.
U.S. Appl. No. 14/197,922, May 15, 2015, Office Action.
U.S. Appl. No. 14/267,447, Jun. 18, 2015, Response to Office Action.
U.S. Appl. No. 14/263,665, Oct. 8, 2015, Office Action.
U.S. Appl. No. 14/053,222, Jan. 29, 2016, Office Action, U.S. Pat. No. 9,606,701.
U.S. Appl. No. 14/311,943, Apr. 27, 2016, Office Action.
U.S. Appl. No. 14/486,550, May 26, 2016, Office Action.
U.S. Appl. No. 14/060,033, Jun. 15, 2016, Office Action.
U.S. Appl. No. 14/172,462, Jul. 6, 2016, Office Action.
U.S. Appl. No. 14/053,222, Jul. 29, 2016, Response to Office Action.
U.S. Appl. No. 14/185,204, Jul. 29, 2016, Office Action.

(56) References Cited

OTHER PUBLICATIONS

U.S. Appl. No. 14/062,947, Sep. 16, 2016, Office Action.
U.S. Appl. No. 14/457,758, Sep. 30, 2016, Office Action.
U.S. Appl. No. 14/457,758, Mar. 29, 2017, Response to Office Action.
U.S. Appl. No. 14/195,391, Oct. 18, 2017, Office Action.
U.S. Appl. No. 14/172,404, Oct. 20, 2017, Office Action.
U.S. Appl. No. 14/275,116, Dec. 28, 2016, Office Action.
U.S. Appl. No. 14/303,372, Jan. 11, 2017, Office Action.
U.S. Appl. No. 14/246,254, Jan. 11, 2017, Office Action.
U.S. Appl. No. 14/229,008, Jan. 13, 2017, Office Action.
U.S. Appl. No. 14/060,033, filed Oct. 22, 2013.
U.S. Appl. No. 14/053,222, filed Oct. 14, 2013, now U.S. Pat. No. 9,606,701.
U.S. Appl. No. 14/172,462, filed Oct. 16, 2013.
U.S. Appl. No. 14/062,947, filed Oct. 25, 2013.
U.S. Appl. No. 14/172,404, filed Feb. 4, 2014.
U.S. Appl. No. 14/303,372, filed Jun. 12, 2014.
U.S. Appl. No. 14/185,204, filed Feb. 20, 2014.
U.S. Appl. No. 14/195,391, filed Mar. 3, 2014.
U.S. Appl. No. 14/246,254, filed Apr. 7, 2014.
U.S. Appl. No. 14/229,008, filed Mar. 28, 2014.
U.S. Appl. No. 14/197,922, filed Mar. 5, 2014.
U.S. Appl. No. 14/263,665, filed Apr. 28, 2014.
U.S. Appl. No. 14/267,447, filed May 1, 2014.
U.S. Appl. No. 14/311,943, filed Jun. 23, 2014.

\* cited by examiner

| CAD Context Database 500 | | | | | | | | | |
|---|---|---|---|---|---|---|---|---|---|
| | Required Information | | | | | | Search Address | | |
| Command Topic | Part Material | Min/Max Thickness | Surface Area | Hole Diameters | Overall Part Dimensions (L x W x H) | Flat Boundary Dimensions | Formula based calc? | McMaster Carr | PEM | Metal Depot | etc... |
| Screw | Yes | Yes | X | Yes | X | X | Yes | X | Yes | X | ... |
| Bolt | Yes | Yes | X | Yes | X | X | Yes | Yes | X | X | ... |
| Nut | Yes | X | X | Yes | X | X | X | Yes | Yes | X | ... |
| Sheet Metal | Yes | Yes | Yes | X | Yes | Yes | X | X | X | Yes | ... |
| Rip | X | Yes | X | X | X | Yes | Yes | X | X | X | ... |
| Bend | Yes | Yes | X | X | X | Yes | Yes | X | X | X | ... |
| Rivet | Yes | Yes | X | Yes | X | X | Yes | X | X | X | ... |
| Seam Weld | Yes | Yes | X | X | X | X | Yes | X | X | X | ... |
| etc... | ... | ... | ... | ... | ... | ... | ... | ... | ... | ... | ... |

FIG. 5

NATURAL LANGUAGE USER INTERFACE FOR COMPUTER-AIDED DESIGN SYSTEMS

RELATED APPLICATION DATA

This application is a continuation of U.S. patent application Ser. No. 14/486,550, filed on Sep. 15, 2014, and entitled "Natural Language User Interfaces For Computer-Aided Design Systems," which is incorporated by reference herein in its entirety.

FIELD OF THE INVENTION

The present invention generally relates to the field of computer-aided design. In particular, the present invention is directed to natural language user interfaces for computer-aided design systems.

BACKGROUND

Computer-aided design (CAD) programs allow designers to create computer models of products to be manufactured. Such programs can be incredibly complex and take extensive training and use before a designer becomes efficient in the use of the program. Natural language interfaces have been proposed as a means for simplifying many different human-machine interactions. While such programs are having increasing success in terms of adoption for general use, for example, the ability to ask simple questions like weather or direction queries of a mobile phone interface (see, e.g., US Pub. No. 2012/0016678, entitled "Intelligent Automated Assistant," which is incorporated by reference herein in its entirety), such systems still do not provide an adequate or user-friendly interface for many complex systems, such as CAD programs, that employ specialized language and wherein context-specific terminology has multiple meanings and/or multiple defining parameters that vary with the context.

While attempts have been made at providing natural language interfaces for CAD systems (see, e.g., US Pub. No. 2009/0058860, entitled "Method For Transforming Language Into A Visual Form," which is incorporated by reference herein in its entirety), such systems in themselves have been overly complex and have not produced results that have led to general application and use.

SUMMARY OF THE DISCLOSURE

In an implementation, the present disclosure is directed to a machine-readable storage medium containing machine-executable instructions for performing a method of providing a natural language interface for a computer-aided design (CAD) system. The machine-executable instructions include a first set of machine-executable instructions for automatedly receiving, via an input device of a computing device, a user selection through a graphical user interface (GUI) of a particular location of a displayed CAD model; a second set of machine-executable instructions for automatedly receiving, via the computing device, a user voice input comprising a plurality of words and referring to the particular location; a third set of machine-executable instructions for automatedly, via the computing device, parsing the user voice input; a fourth set of machine-executable instructions for automatedly, via the computing device, determining a meaning for the parsed user voice input, the meaning including a reference to the particular location, one or more words associated with one or more program actions, and one or more words associated with one or more command topics, each of the particular location, program actions, and command topics related to a specific item referred to in the voice input; a fifth set of machine-executable instructions for automatedly, via the computing device and based on the determined meaning, identifying information comprising two or more specifications for the specific item via a CAD context database, wherein the specifications comprise two or more of: a diameter, a length, a depth, a thickness, and a material; a sixth set of machine-executable instructions for automatedly, via the computing device, assembling a query for additional information based on the meaning, the identified information, and the CAD model; a seventh set of machine-executable instructions for automatedly, via the computing device, providing the assembled query to a resource provider service; an eighth set of machine-executable instructions for automatedly, via the computing device, receiving the additional information from the resource provider service, the additional information comprising information regarding at least one CAD model of the specific item to be placed at the particular location selected as a function of the meaning, the identified information, and the CAD model; a ninth set of machine-executable instructions for automatedly, via the computing device, prompting the user for missing information determined as a function of the additional information based on whether the specific item is compatible with one or more aspects of the CAD model when placed at the particular location; a tenth set of machine-executable instructions for automatedly, via the computing device, receiving a response from the user to the prompt for missing information; an eleventh set of machine-executable instructions for automatedly, via the computing device, providing a command to at least one CAD program module based on the additional information and the response from the user to the prompt for missing information; and a twelfth set of machine-executable instructions for automatedly, via the computing device, updating the GUI with respect to the CAD model based on the command.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 5 schematically represents a partial example of information contained within a context database according to an embodiment of the present invention;

FIGS. 7A and 7B are block diagrams schematically illustrating another exemplary embodiment of query generating algorithm, wherein FIG. 7A represents an exemplary parsing algorithm and FIG. 7B represents an exemplary query algorithm.

DETAILED DESCRIPTION

Figure 1A:
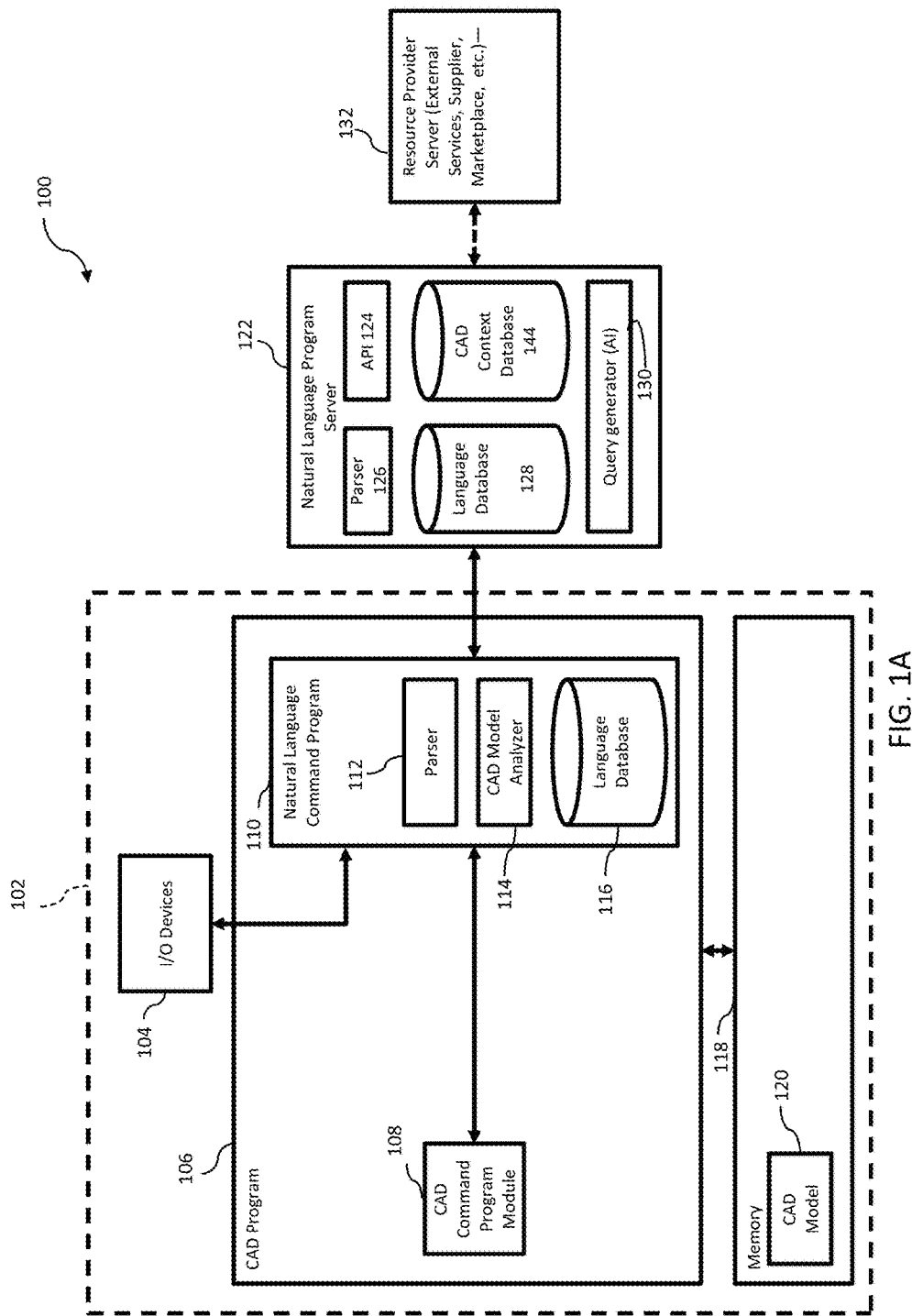
FIG. 1A is a block diagram schematically illustrating a system according to one embodiment of the present invention.

Aspects of the present invention include techniques, methods, hardware and software for providing natural language interfaces in and for computer-aided design (CAD) systems. Exemplary embodiments are described herein below and illustrated in the accompanying drawings. It will be understood by those skilled in the art that various changes, omissions and additions may be made to that which is specifically disclosed herein without departing from the spirit and scope of the present invention.

As used herein, a structure may be an object or part having a particular geometry, and a computer model may be a virtual representation of a structure and may be created using an appropriate CAD system or program. A designer may be the designer of a computer model, a purchaser, an agent of the purchaser, and a consumer, a home user, or a customer, among others. Examples of a structure include a piece of sheet metal, a solid cube, a cylindrical pipe, an injection molded plastic toy, an article of clothing such as a shirt made of cotton, and an assembly of various parts such as a vehicle, among others. A project (or design) may refer to a CAD model of a part or an assembly of CAD models of parts that may be a virtual representation of a particular structure and may be created using one or more appropriate CAD systems or programs.

One or more aspects of the present invention can be implemented in any of a wide variety of manners, such as within a single computing device or by two or more networked computing devices, among others. In some embodiments, functionalities of systems described herein may be integrated into computer modeling programs directly via add-on software.

As would be apparent to one reasonably skilled in the art, aspects and embodiments of the invention may be applied to any number of manufacturing types, including but not limited to the manufacture of apparel and sheet metal products among others. In the case of sheet metal and apparel, designers use CAD systems to design their products, using sheets of flat material for manufacture. Design data, such as material choice, precise dimensions, or locations of additional features may be embedded within the digital design. Designers may choose different metals or fabrics (including non-woven materials such as leather) depending on the strength and other inherent properties of the material, which affects what manufacturing methods may be necessary to work the material. Purchased components (in some cases, identical purchased components) may be added to the design. CAD programs may be used to visualize the shape of the finished product. In both sheet metal and apparel manufacturing the sheet (metal or fabric) may be cut or stamped by a variety of methods using computerized machines. Units are moved from station to station during manufacture. Where sheet metal is connected by rivets or welding, sheet fabric is connected by stitching or gluing. Surface finishes may be applied to both; both may be painted, silk-screened, or otherwise covered with a protective substance. While sheet metal and fabric apparel products have commonalities as discussed above, it will be appreciated by those skilled in the art that other design and manufacturing types which may or may not share many of the same attributes are also amenable to application of embodiments of the present invention.

Referring first to FIG. 1A, an exemplary embodiment of a system 100 in accordance with the teaching of the present invention is described. In one implementation, system 100 comprises one or more computing devices with appropriately networked and/or communicating modules. For example, sub-system 102 may comprise a computer, other computing device or other system as may be devised by a person of ordinary skill for executing functionalities as described herein based on appropriately coded instructions. I/O devices 104 include language-based I/O devices such as a microphone and speakers, as well as other I/O devices such as mouse, keyboard, touch pad or touch screen. CAD program 106 and memory 118 are also included in sub-system 102. CAD program 106 includes, in addition to conventional CAD system functionality, natural language command program 110. Natural language command program 110 comprises parser 112, CAD model analyzer 114 and language database 116. CAD model 120 typically resides in a memory device, such as memory 118 although the memory need not be configured as a part of the system per se, but may be functionally remote and communicate with the system through an appropriate network.

CAD model analyzer 114 functions as a form of interrogator that interrogates the CAD model to return CAD model data as called for by various program functions. In some embodiments, other system modules may include and/or maintain such an interrogator for interrogating information from a CAD model. Additionally or alternatively, natural language program sever module 122, and/or resource provider server module 132 may contain such an interrogator, for example, as a portion of or add-on to a CAD program. CAD model analyzer 114 may analyze a CAD model and output data that may be received and used by natural language command program module 110 or other system modules. Illustrative embodiments for such an analyzer/interrogator may be found in U.S. patent application Ser. No. 14/060,033, filed on Oct. 22, 2013, and titled "AUTOMATED FABRICATION PRICE QUOTING AND FABRICATION ORDERING FOR COMPUTER-MODELED STRUCTURES", which is incorporated by reference herein for its teachings of extracting data from computer models, and U.S. patent application Ser. No. 14/282,773, filed on May 20, 2014, and titled "METHODS AND SOFTWARE FOR ENABLING CUSTOM PRICING IN AN ELECTRONIC COMMERCE SYSTEM", which is incorporated by reference herein for its teachings of particular interrogator engines.

CAD program module 106 may comprise any of the modules in a conventional CAD system or program that govern one or more functions of the CAD program as would be understood by persons of ordinary skill in the art. Examples of other CAD system models, not shown, may include: create new item module, select material module, bend module, weld module or cut module. However, natural language command program module 110 is in addition to the conventional modules of the CAD system or program.

Parser 112 parses content of spoken commands received through I/O devices 104 and communicates with language database 116 to determine relevant portions of the spoken command for formulating a query as discussed in more detail below. CAD model analyzer 114, like interrogator, searches for specific information in CAD model 120 and communicates with natural language server module 122.

Natural language program server module, which may be remotely located, may comprise a high capacity server/database to assist in parsing any natural language commands that cannot be parsed through resident module 110. Thus, natural language program server module 122 includes parser 126, which is similar in function to parser 112 but more powerful, and API 124, which would be used to translate commands into required syntax for other system modules, for example, to communicate with resource provider server module 132. Language database 128 is a larger, more powerful version of database 116, and may comprise multiple specialized, plurally accessible library-type databases. Query generator 130 may comprise the artificial intelligence for query generation as described herein below (see, for example, FIGS. 6, 7A and 7B) and thus may comprise a processor and memory of its own, as well as other associated hardware and software suited for its query generation function. CAD context database 144 contains CAD specific information as shown in FIG. 5 and described in more detail below.

Resource provider server module 132 provides external services and/or information when called for by module 122. For example, when information needed to respond to a query resides outside of the CAD system and natural language program server module 122, automated searching of appropriate databases is initiated, the databases being supplied as resource provider server modules 132 in order to provide information from suppliers, marketplaces, and other external services. In some examples, resource provider server module 132 is an external service supplier marketplace database, either a source of information or standalone entity that will perform calculations.

In operation a natural language command plus any additional information concomitantly entered is received through I/O devices 104 and directed to natural language command program module 110, which then parses the command, breaking it into pieces and identifying, using language database 116, the meaning of the command. Information that is identified as being contained within CAD model 120 is analyzed and retrieved by CAD model analyzer 114 by interrogating the CAD model. If for some reason natural language command program module 110 is unable to determine the meaning of a command, it will send an audio file to natural language program server module 122 to be further parsed by parser 126, accessing language database(s) 128. Also at this point, CAD context database 144 communicates with parser 126 to determine what information must be pulled from CAD model 120. Pulled information is sent back through CAD model analyzer 114 to server module 122 and query generator 130 generates a query based on retrieved information.

CAD context database 144 supplements language databases 116 and 128 with CAD specific contextual information that is accessed, for example, when parser 126 is unable to parse a command by access to the more general language databases or if more than one contextual meaning is identified. For example, CAD context database 144 contains information necessary to identify a bolt as a purchase part that is associated with a nut, to separate it from other general language context meanings (i.e., to leave quickly or a lightning bolt). CAD context database 144 also contains information to direct natural language server program module 122 to query resource provider modules 132 when supplier-type or other externally provided information is needed for query completion.

If the query can be executed by the CAD program without further information or data inputs, then the command is translated to the CAD program through natural language command program module 110. However, when the query requires additional, non-resident information, the query is then translated by API 124 and sent to resource provider server module 132 for answer. When the response is returned from resource provider server module 132, API 124 translates the response into a format that can be used by the CAD program module and it is sent back through natural language command program module 110, which delivers an output, such as an auditory output, through I/O devices 104 and/or instructs the CAD command program module 108 to execute the command.

Figure 1B:
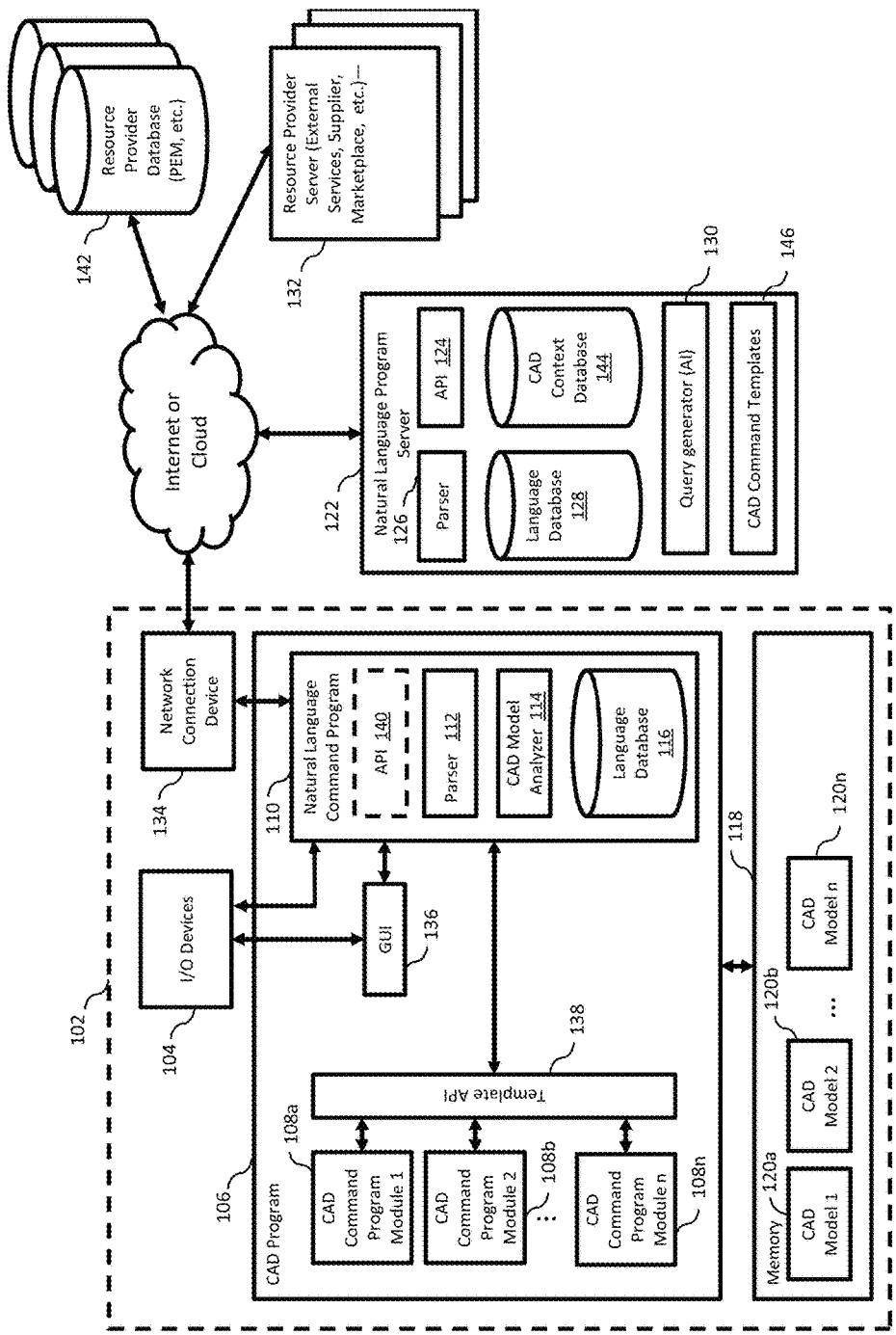
FIG. 1B is a block diagram schematically illustrating an alternative system according to another embodiment of the present invention.

With reference to FIG. 1B, a further alternative system is described. As will be seen, the basic components of FIG. 1A are carried over to the embodiment of FIG. 1B. Added components include network connection device 134 that permits communication with an network, the Internet or information stored in a cloud. Communication through this path may be with natural language program server module 122 as previously described, as well as multiple resource provider server modules 132 and direction with resource provider databases 142.

In this embodiment, CAD program 106 also includes plural CAD program modules 108a, b . . . n communicating with natural language command program module 110 through template API 138. Template API 138 is used to translate commands and other information coming back from the natural language command program module 110 into a command that can be used by the particular CAD program. GUI 136 is also added, optionally communicating between I/O devices 104 and natural language command program module 110 to facilitate interaction with the user. Optional API 140 inside natural language command program module 110 translates and facilitates communications between the various sub-modules.

Within natural language program server module 122, CAD command templates 146 are used in conjunction with template API 138 to send instructions in the language that the CAD program will understand. Thus, CAD model 120a, b, . . . n is to be changed using a command program module. Template API 138 translates a command in a template form to a command that is actually understood by the module.

The following prophetic examples further illustrate operation of embodiments of the system thus described. As is typical in natural language interfaces, the "system" is assigned a name to be spoken by the user to initiation language recognition and parsing, and to distinguish commands from other spoken words. Any suitable name may be assigned. In this case, for illustration purposes only, the assigned name is "Nalcop," representing natural language command program module 110.

Example 1—In operation, a user clicks a hole and says, "Nalcop, I need bolts to fit this hole." Nalcop parses the command with parser 112 and determines that "this hole" refers to a highlighted feature in the displayed CAD model. Natural language command program module 110 then uses CAD model analyzer 114 to gather all data related to the hole from CAD model 120. Then, it sends the data plus message to natural language command program server module 122, where the natural language statement and CAD model data is further parsed (if necessary). Query generator 130 creates a search command using the parsed statement and the CAD model data, and searches resource provider server modules 132 or databases 142 for bolts of the correct diameter and correct length that are compatible with the material in which the hole is located. That data is returned to natural language command program module 110, which displays it in GUI 136.

Example 2—In operation, a user says, "Nalcop, this shelf needs to hold 40 pounds." Natural language command program module 110 cannot initially parse this command, so it sends a voice record to natural language program server module 122. Server module 122 parses the statement and determines that the user's statement is a request to calculate whether the structure can hold 40 pounds. Based on this determination, made using parser 126, language database 128 and CAD context database 144, server module 122 sends natural language command program module 110 instructions to analyze the entire CAD model (to get material, thickness, and angles) and to ask the user which way is up (e.g. necessary to know directionality to perform the analysis) and what factor of safety the user would like to use (e.g., necessary to know how sure the user wants to be that the shelf will hold 40 pounds). Natural language command program module 110 thus poses the required questions through GUI 136 and/or I/O devices 104 and waits for a response from the user. Required CAD model data is accessed by CAD model analyzer 114, combined with user inputs in response to stated questions and transmitted to server module 122. API 124 puts the information in the correct format and sends the data to a resource provider server module 132 which can perform a stress (statics) analysis on a model of that shape using that material. If the analysis determines that the aluminum brackets supporting the shelf will not support the weight, server module 122 sends a "no" answer to natural language command program module 110, which communicates the answer to the user through GUI 136 and/or I/O devices 104. Such communication may take the form of a statement delivered through system speakers. The user may choose to respond to the "no" answer with a further question, such as "Well Nalcop, what will work?" In such a case, that question is parsed to be a request for design modifications. Server module 122 sends common fabrication material options to resource provider server modules 132 to determine whether using a different material in the bracket will work. For purposes of this example, assume stainless steel would be sufficient to hold the weight. In this case, server module 122 may also send different bracket thicknesses, but using the original material (aluminum), to resource provider server modules 132. Assume it is determined that doubling the thickness in the original material will also work. Server module 122 then sends natural language command program module 110 information that the CAD model as it exists will not hold 40 pounds, but stainless steel or double-thickness aluminum will. Natural language command program module 110 then prompts the user through I/O devices 104 and or GUI 136 to indicate whether he wants to use stainless steel or double the thickness of aluminum. The user selection is sent back to server module 122, which fills out a CAD Command Template 146, which is sent back through natural language command program module 110 to template API 138, which instructs CAD program module(s) 108*a, b . . . n* to make the change.

Figures 2, 4:
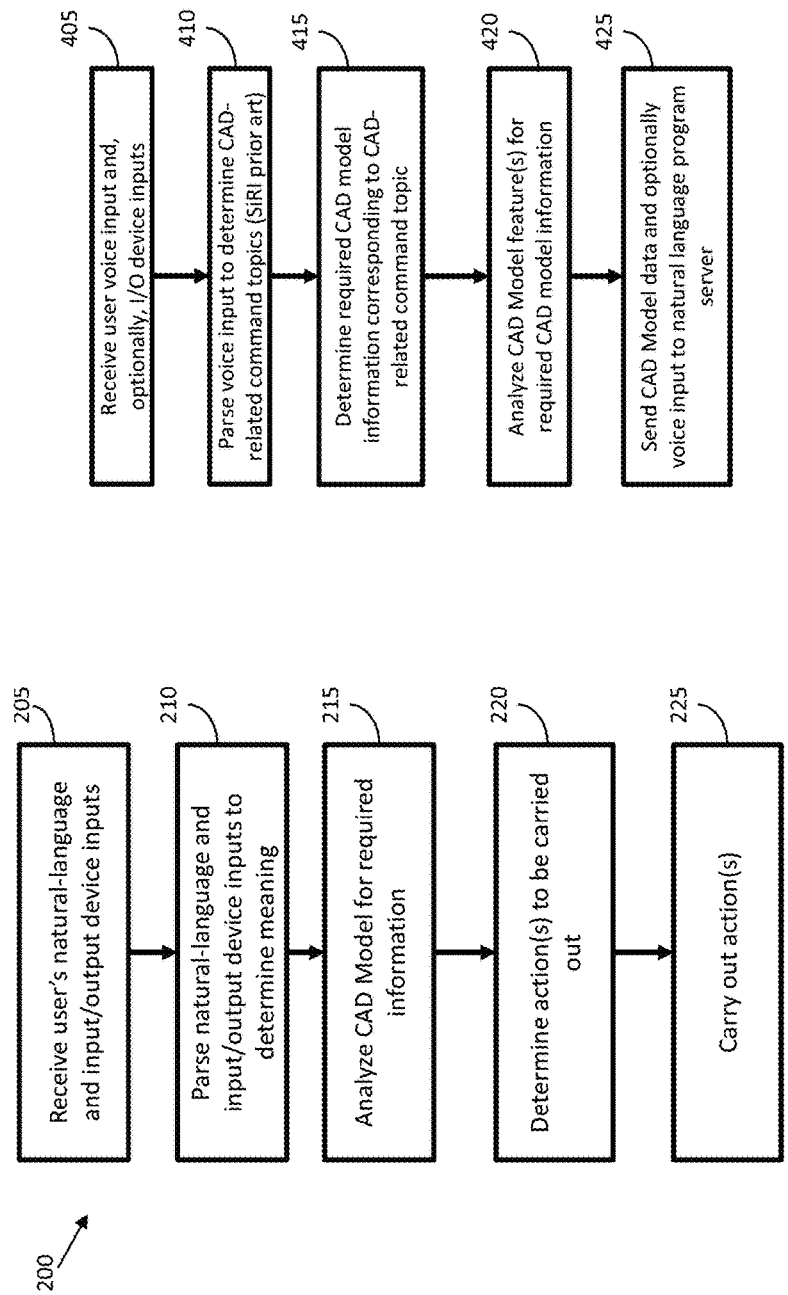
FIG. 2 is a flow diagram illustrating a high level method according to an embodiment of the present invention.
FIG. 4 is a flow diagram illustrating a sub-step within the embodiments shown in FIG. 2 or 3.
Figure 3:
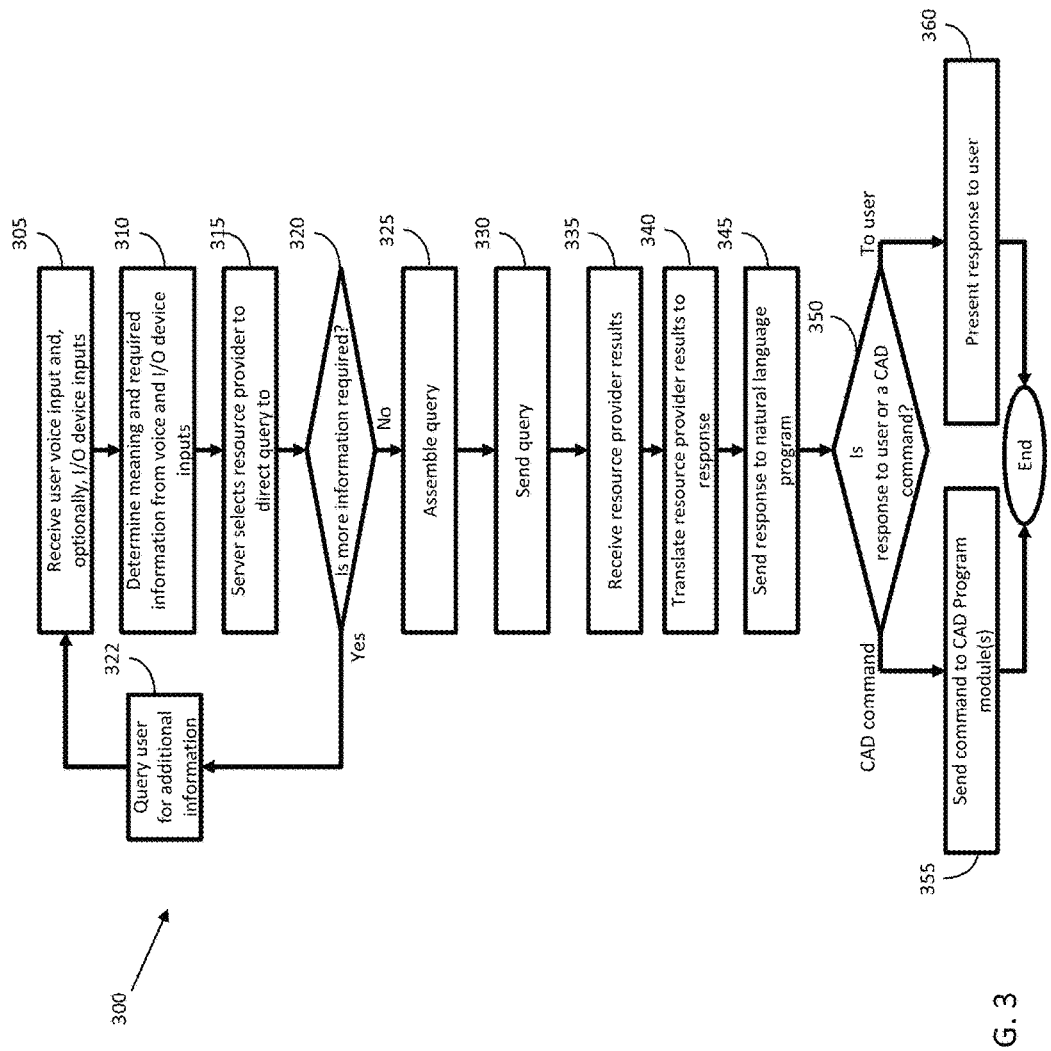
FIG. 3 is a flow diagram illustrating another embodiment of a method according to the present invention with more detail.

Operation of embodiments of the present invention may be further understood with references to the flow diagrams in FIGS. 2, 3 and 4. FIG. 2 illustrates a high level method comprising five general steps. Step 205 comprises receiving user natural language and input/output device inputs, in other words the user speaks and may also use keyboard or mouse to highlight. For example, a user may say "I need a bolt to fit this hole" while using the mouse to identify the hole and natural language command program module 110 will appropriately associate the two different types of inputs based on context and proximity in time. For example, the context of the parse can include recognition of keyboard/mouse commands such as "make this <highlighted with mouse>, aluminum." In a further alternative, distinct commands may be assigned to correspond to the mouse or keyboard commands so that context is not required, for example, predetermining that spoken "this" plus an immediate physical I/O action go together.

Step 210 comprises parsing the natural language inputs to determine meaning and required information. Step 215 comprises analyzing CAD model 120 for required information, typically using CAD model analyzer 114. Step 220 comprises determining actions to be carried out, for example determining results using resource provider server modules or databases as described above. Step 225 comprises carrying out the action or actions or delivering results to the user.

More detailed method steps are described in connection with the embodiment shown in FIG. 3. In this embodiment, a first step 305 comprises receiving a user voice input and optionally input/output device input as described. In step 310 the meaning of voice and I/O device inputs is determined. More detail on this step is provided in the discussion of FIG. 4 below. Next, at step 315, server module 122 selects a resource provider server module 132 to which the query is to be directed.

Step 320 requires a determination of whether more information is required. If YES, step 322 generates a query to the user to provide additional information and program flow returns to step 305 upon information receipt. If NO, program flow continues on to step 325. In step 325 the query is assembled and then sent in step 330. In step 335 resource provider results are received from either or both of the resource provider server module or databases. Step 340 comprises translating the resource provider results to a response in a form useable by the CAD system. In step 345, the translated response is sent to the natural language command program module.

Step 350 requires another determination, in this case whether the returned response is a CAD command or a response to be directed to the user. In other words, is the response something that is intended to seek feedback or find answer from the user, or is it really a CAD command that should be going into the CAD program for execution? If a CAD command, it is routed at 355 for execution by a CAD program module; if a user response, it is routed at 360 to an appropriate I/O device for communication with the user.

Turning now to FIG. 4, more detail of the command meaning determination in step 310 above is provided. The process in this embodiment begins at step 405 with receiving user voice input and optionally I/O device input, in this case the same as step 305. Next, in step 410, the voice input is parsed to determine the meaning as is generally understood by persons skilled in the art of natural language program interfaces. In step 415, required CAD model information corresponding to as determined CAD-related command topics is further determined. In step 420, CAD model features are analyzed (for example, by CAD model analyzer 114) for required CAD model information. Thereafter, in step 425, CAD model data and optionally voice input are sent to the natural language program server module for further action as elsewhere described herein.

FIG. 5 illustrates exemplary contents of CAD context database 500 in an abbreviated form suitable for representation within the drawings of a patent application. As will be appreciated by persons of ordinary skill, the contents of a CAD context database as described herein will in practice be substantially more voluminous. In the examples illustrated in the figures provided herewith, CAD context database 500 is located within natural language program server module 122. However, it may be otherwise located without departing from the scope of the invention.

As illustrated in the example of FIG. 5, CAD context database 500 comprises a series of command topics in a first column and at least two super-columns thereafter that identify required information and corresponding search addresses or locations for information corresponding to each command topic. In this example, a "Yes" entry in any column indicates applicable or required information, and an "X" entry indicates that information is not required or not applicable. The required information super-column indicates each specific type of information that CAD analyzer 114 must pull from CAD model 120 to respond to a command related to the indicated topic or which must be obtained from a resource provider or other third party source. The search address super-column indicates applicable sources associated with each topic from which the required information may be potentially obtained. In this example, for illustration purposes, the search address columns have been populated with a number of well-known industrial suppliers—McMaster Carr, PEM and Metal Depot—but any source of information appropriate for the particular structures to be made may be populated in the search address columns. Also, when formula-based calculations are required, as explained in further detail below, the source of the formula may be a memory location or calculation engine located within the system or internally networked, in addition to third party or cloud sources.

Figure 6:
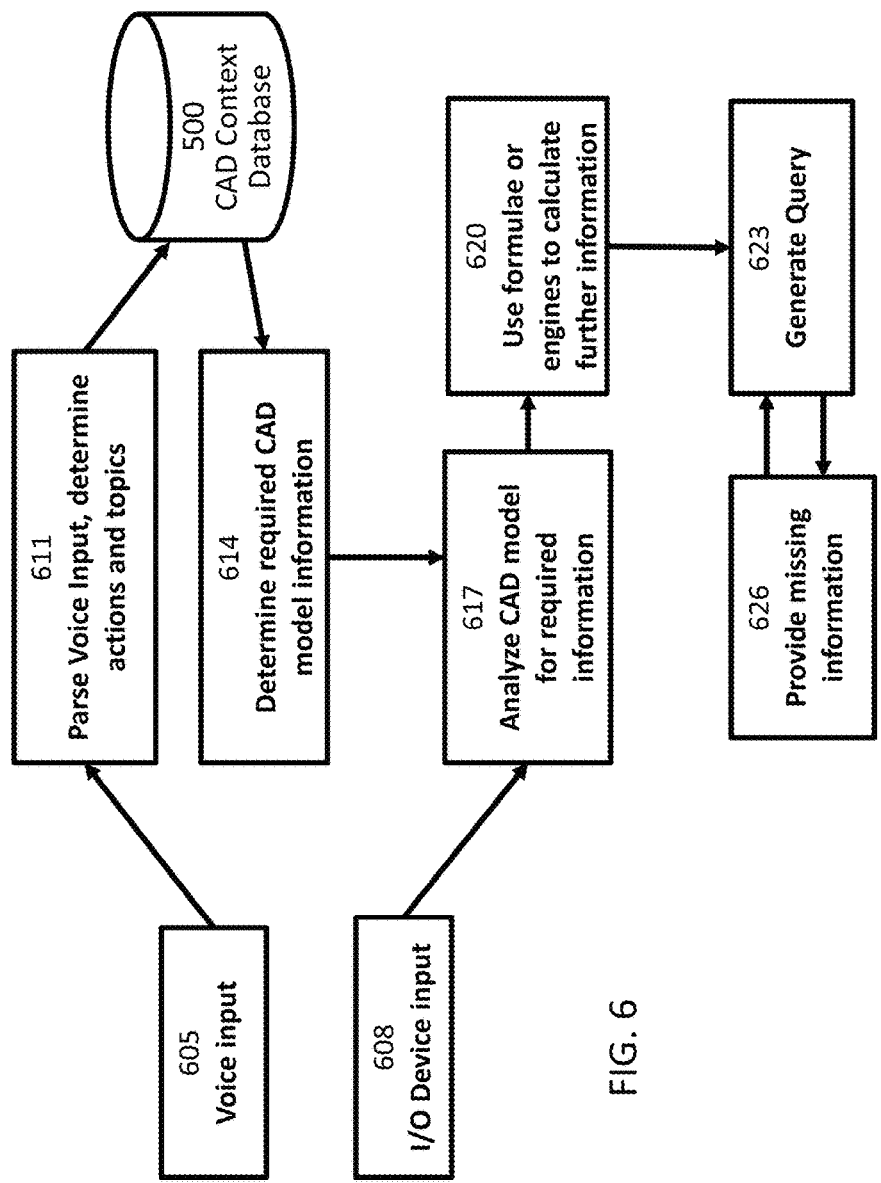
FIG. 6 is a flow diagram illustrating one possible embodiment of a query generation algorithm according to the present invention.

The information thus provided by CAD context database 500 is used to generate search queries, for example as shown in FIG. 6. The flow diagram of FIG. 6 illustrates one possible algorithm for query determination according to embodiments of the present invention, which will be illustrated by two examples with reference to FIG. 6 and Table 1 below. In step 605, a voice input is provided, such as "Nalcop, can you find a bolt to fit the selected hole?" Simultaneously or at a time in close proximity to the voice input, a device input is also provided in step 608. This device input may, in this example, be mouse clicking on a hole in the displayed structure from the CAD model. Next, at step 611 the voice input is parsed to determine actions, topics and required information. In this example, bolt as a topic returns needed information such as diameter, length, and material. This information is returned from CAD context database 500 as described above.

Based on information returned from CAD context database 500, at step 614, a determination is made as to the required CAD model information. In this example, required CAD information includes hole diameter, the material, and thickness of material at the hole location. With this information, at step 617, the CAD model is analyzed to extract the required information. In this example, extracted information may be diameter=0.5 in, thickness=1.5 in to 2.0 in, and material=aluminum. Once required information is returned, at step 620, formulae or engines are accessed and applied as needed to calculate further required information. In this example, max bolt diameter might be calculated at 0.95 in and minimum bolt length at 1.1 in.

With all necessary information in hand, a query is generated at step 623. A hypothetical query for this example may include the following fields and corresponding information: Address: McMaster Carr catalog; Action: search—Term 1: "bolt"—Term 2: "diameter=0.950 in"—Term 3: "length>1.65 in to 2.2 in"—Term 4: "material=aluminum". To the extent any information is determined to be missing, it is provided at step 626. For example, the length of fitting parts could be much longer than thickness of material, leading to many possible fitting results, in which case the natural language command program module will ask the user "What length part do you want?"

Table 1 below shows how the initial search request—"Nalcop, can you find a bolt to fit the selected hole?"—is parsed and the associated program actions and other associated events that flow from the request.

TABLE 1

| Parsed Voice Input | "Nalcop" | "can you find" | "a bolt" | "to fit" | "the selected" | "hole?" |
|---|---|---|---|---|---|---|
| I/O Device Association | N/A | N/A | N/A | N/A | "selected" = identify I/O device input for selected feature | N/A |
| Program Actions and Topics | "Nalcop" = Activate natural language program interface | "you find" = Action will be a search | "bolt" = Recognize CAD Context Term; Retrieve Term-Specific parameters for search from CAD Context Database | Identify selected feature and determine associated parameters (e.g. hole diameter, depth & surrounding material) Construct query: "fit . . . selected hole" [verb + direct object] = correlate feature parameters (e.g. hole diameter, depth & surrounding material) with CAD Context Term Specific Parameters (e.g. bolt diameter, length & material) and other purchased parts compatibility data. | | |
| CAD Context Database Interaction | N/A | N/A | Supply Term-Specific Parameters (for bolt, e.g., diameter, length, material) | | N/A | N/A |
| Resource Provider Extension Actions and Topics | N/A | Search | Address = McMaster Carr catalog  Search term = bolt | Required corresponding CAD-interrogated information used to narrow search (e.g., Search term = diameter of hole; Search term = material; Search term = thickness of material) | | |

A second example follows that illustrates a variation of parameters when the request is for a stud rather than a bolt:

605 Voice Input—"Nalcop, can you find a stud to fit the selected hole?"

608 I/O Device Input—Mouse clicks on a hole

611 Parse Voice Input and determine actions and topics (Stud=diameter, length, material) by accessing CAD Context Database 500

614 Determine required CAD model information (CAD information=diameter of hole, thickness of material, material)

617 Analyze CAD model for required information (Diameter=0.25 in Thickness=0.090 in Material=Aluminum)

620 Use formulae or engines to calculate further information (Diameter+/−0.10 in Thickness=/−0.007 in)

623 Generate Query Addresses (PEM catalog Action: search—Term 1: "stud"—Term 2: "diameter=0.15 in to 0.35 in"—Term 3: "thickness=0.083 in to 0.097 in"—Term 4: "material=aluminum")

626 Provide missing information (After query is executed, the length of the stud can be variable and independent of the part being analyzed, leading to many possible choices. NLCP Module 110 asks, "Is there a specific length stud you want?" This information is then added to the query as Term 5 and the query is executed again)

Figure 7A:
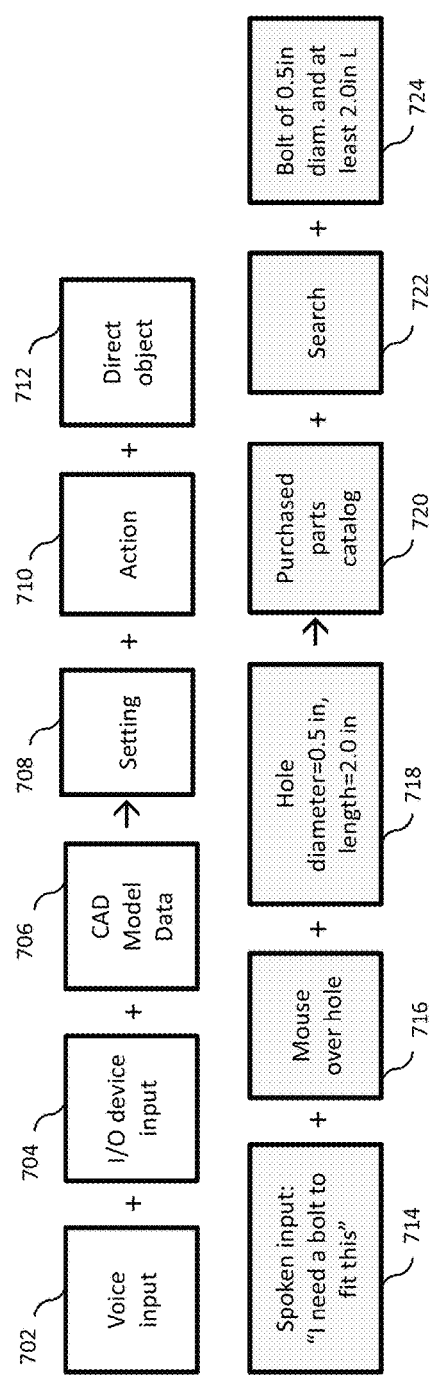
Figure 7B:
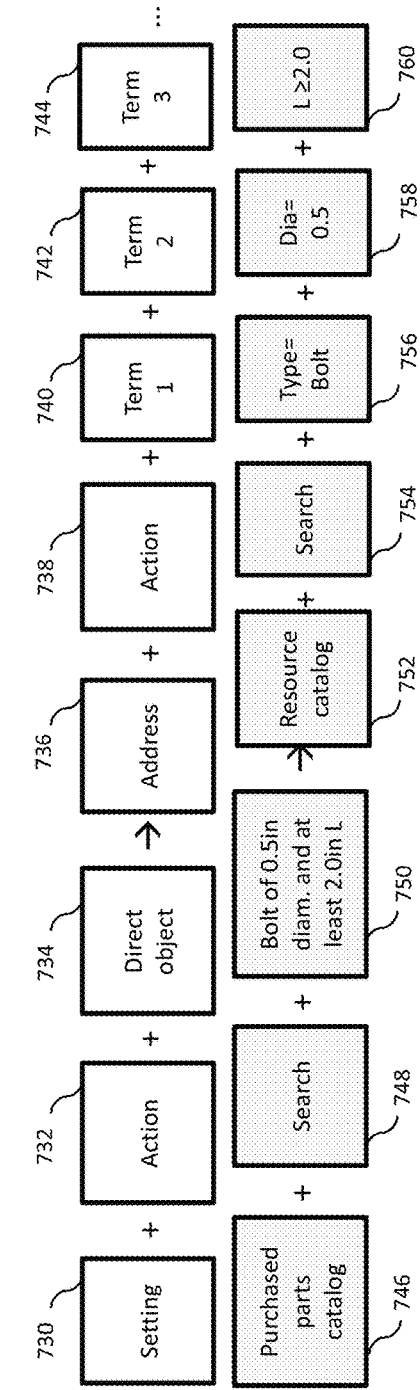

FIGS. 7A and 7B illustrate further alternative parsing and query algorithms, respectively, according to alternative embodiments of the invention. In each figure there are generic steps along the top row and a specific example in the boxes of the bottom row. In this alternative parsing algorithm there is voice input 702 plus I/O device input 704 plus CAD model data 706 that is the basis for output setting 708 plus action 710 plus direct object 712. The corresponding specific examples are, respectively, the voice input of natural language command program module 110 is "I need a bolt to fit this" 714 and mousing over the hole as I/O device input 716 plus CAD model data the hole diameter is half an inch and length is two inches 718, is the basis for a setting of purchased parts catalog 720, an action of search 722, and then the direct object or the search terms is "bolt of half an inch diameter and at least two inches length" 724.

The setting, action and object thus determined forms inputs to the query algorithm shown in FIG. 7B, wherein the setting 730 plus action 732 plus direct object 734 generate an address 736 plus action 738 plus search term(s) 740-744. These generic algorithm steps correspond, in this specific example, to, respectively, an actual query of purchased parts catalog 746 plus search 748 plus Bolt of 0.5 in diameter and at least 2 in length 750, provides a specific address of a resource catalog 752, a specific action of the search 754 and three search terms 756, 758 and 760 that come out of the direct object.

In one further embodiment, a local sub-server may be provided with specialized language databases that apply only to a group of designers so that the group may create or use their own individualized glossary commands and terms that might not be used by others outside the group and thus would not parse correctly. This would allow, for example, the users of that group to drop common adjectives from names when all parts have that name. For example, if all bolts were red, it would not be necessary for users within the identified group to specify a red bolt because the system would know the bolt color was red unless otherwise stated.

In another embodiment, a voice recognition sub-module may be included within natural language command program module 110 so that commands can be locked out from unrecognized voices to permit only authorized users to edit the CAD model. For example, such functionality may help to prevent untrained users from changing the CAD model inadvertently. Also, further functionality may be added to permit response by the system in natural language to questions about why a specific command or operation is not working. For example, if an initial command comprises a request to add a steel bolt to an aluminum structure and the system does not allow it because steel fasteners pull through the aluminum, the natural language command program module 110 would respond with an error message or say "this won't work" in audible tone all of the words—"this won't work for these reasons." This could be very helpful to users, especially for those people learning as they make mistakes and understand why it's wrong not just that it's wrong.

Another alternative embodiment may present help menu material tutorials as a natural language response, effectively reading the manual, so that, for example, the user may concentrate on the actions necessary with the keyboard and mouse without diverting his eyes to read from the screen.

It is to be noted that any one or more of the aspects and embodiments described herein may be conveniently implemented using one or more machines (e.g., one or more computing devices that are utilized as a user computing device for an electronic document, one or more server devices, such as a document server) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk (e.g., a conventional floppy disk, a hard drive disk), an optical disk (e.g., a compact disk "CD", such as a readable, writeable, and/or re-writable CD; a digital video disk "DVD", such as a readable, writeable, and/or rewritable DVD), a magneto-optical disk, a read-only memory "ROM" device, a random access memory "RAM" device, a magnetic card, an optical card, a solid-state memory device (e.g., a flash memory), an EPROM, an EEPROM, and any combinations thereof. A machine-readable medium, as used herein, is intended to include a single medium as well as a collection of physically separate media, such as, for example, a collection of compact disks or one or more hard disk drives in combination with a computer memory. As used herein, a machine-readable storage medium does not include a signal.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a personal digital assistant "PDA", a mobile telephone, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 8:
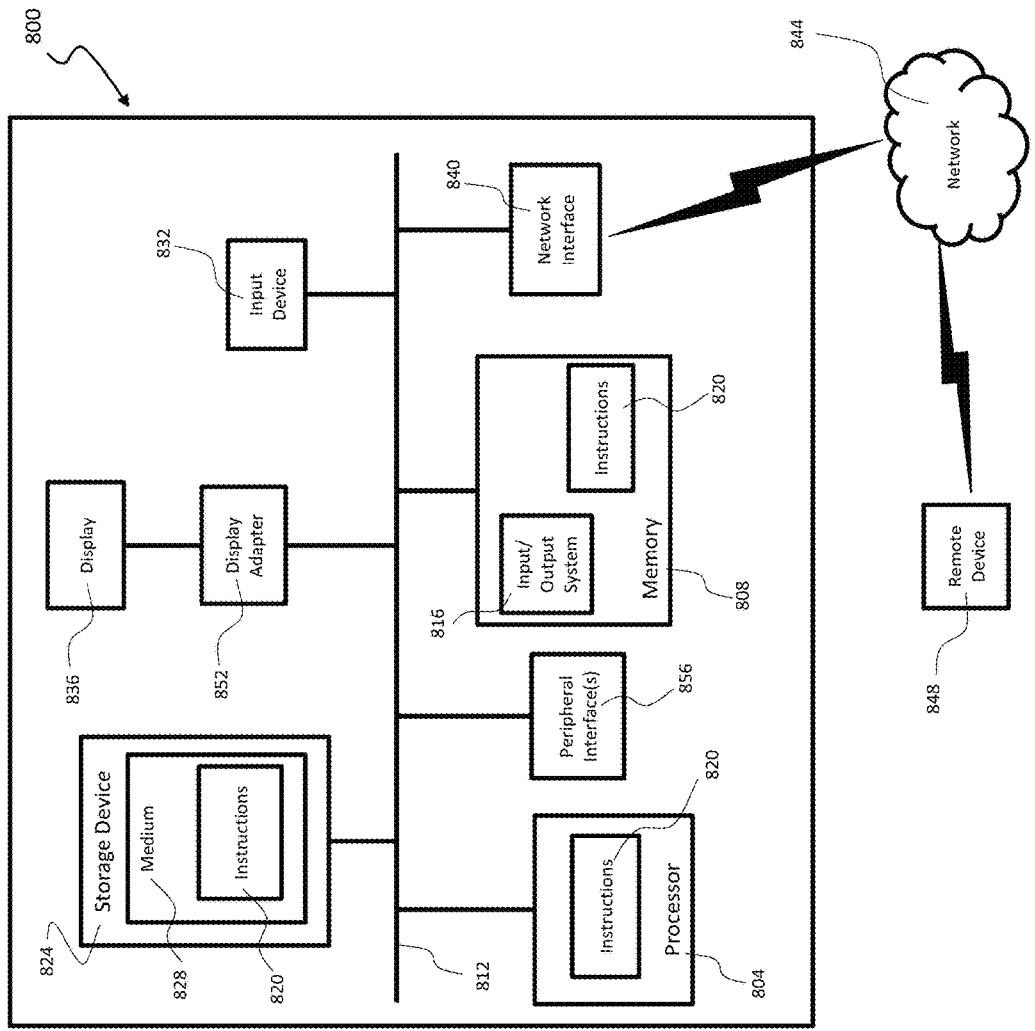
FIG. 8 is a block diagram schematically illustrating exemplary hardware implementations of embodiments of the present invention.

FIG. 8 shows a diagrammatic representation of one embodiment of a computing device in the exemplary form of a computer system or computing module 800 within which a set of instructions for causing a control system, for example, system 100, sub-system 102 or CAD program module 106, to perform any one or more of the aspects and/or methodologies of the present disclosure may be executed. It is also contemplated that multiple computing devices may be utilized to implement a specially configured set of instructions for causing the device to perform any one or more of the aspects and/or methodologies of the present disclosure. Computer system or module 800 includes a processor 804 and a memory 808 that communicate with each other, and with other components, via a bus 812. Bus 812 may include any of several types of bus structures including, but not limited to, a memory bus, a memory controller, a peripheral bus, a local bus, and any combinations thereof, using any of a variety of bus architectures.

Memory 808 may include various components (e.g., machine readable media) including, but not limited to, a random access memory component (e.g., a static RAM "SRAM", a dynamic RAM "DRAM", etc.), a read only component, and any combinations thereof. In one example, a basic input/output system 816 (BIOS), including basic routines that help to transfer information between elements within computer system 800, such as during start-up, may be stored in memory 808. Memory 808 may also include (e.g., stored on one or more machine-readable media) instructions (e.g., software) 820 embodying any one or more of the aspects and/or methodologies of the present disclosure. In another example, memory 808 may further include any number of program modules including, but not limited to, an operating system, one or more application programs, other program modules, program data, and any combinations thereof.

Computer system 800 may also include a storage device 824. Examples of a storage device (e.g., storage device 824) include, but are not limited to, a hard disk drive for reading from and/or writing to a hard disk, a magnetic disk drive for reading from and/or writing to a removable magnetic disk, an optical disk drive for reading from and/or writing to an optical medium (e.g., a CD, a DVD, etc.), a solid-state memory device, and any combinations thereof. Storage device 824 may be connected to bus 812 by an appropriate interface (not shown). Example interfaces include, but are not limited to, SCSI, advanced technology attachment (ATA), serial ATA, universal serial bus (USB), IEEE 1244 (FIREWIRE), and any combinations thereof. In one example, storage device 824 (or one or more components thereof) may be removably interfaced with computer system 800 (e.g., via an external port connector (not shown)). Particularly, storage device 824 and an associated machine-readable medium 828 may provide nonvolatile and/or volatile storage of machine-readable instructions, data structures, program modules, and/or other data for computer system 800. In one example, software 820 may reside, completely or partially, within machine-readable medium 828. In another example, software 820 may reside, completely or partially, within processor 804.

Computer system 800 may also include an input device 832. In one example, a user of computer system 800 may enter commands and/or other information into computer system 800 via input device 832. Examples of an input device 832 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), touchscreen, and any combinations thereof. Input device 832 may be interfaced to bus 812 via any of a variety of interfaces (not shown) including, but not limited to, a serial interface, a parallel interface, a game port, a USB interface, a FIREWIRE interface, a direct interface to bus 812, and any combinations thereof. Input device 832 may include a touch screen interface that may be a part of or separate from display 836, discussed further below. Input device 832 may be utilized as a user selection device for selecting one or more graphical representations in a graphical interface as described above.

A user may also input commands and/or other information to computer system 800 via storage device 824 (e.g., a removable disk drive, a flash drive, etc.) and/or network interface device 840. A network interface device, such as network interface device 840 may be utilized for connecting computer system 800 to one or more of a variety of networks, such as network 844, and one or more remote devices 848 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 844, may employ a wired and/or a wireless mode of communication. In general, any network topology may be used. Information (e.g., data, software 820, etc.) may be communicated to and/or from computer system 800 via network interface device 840.

Computer system 800 may further include a video display adapter 852 for communicating a displayable image to a display device, such as display device 836. Examples of a display device include, but are not limited to, a liquid crystal display (LCD), a cathode ray tube (CRT), a plasma display, a light emitting diode (LED) display, and any combinations thereof. Display adapter 852 and display device 836 may be utilized in combination with processor 804 to provide graphical representations of aspects of the present disclosure. In addition to a display device, a computer system 800 may include one or more other peripheral output devices including, but not limited to, an audio speaker, a printer, and any combinations thereof. Such peripheral output devices may be connected to bus 812 via a peripheral interface 856. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. Additionally, although the methods herein have been illustrated as being performed in a specific order, the ordering is highly variable within ordinary skill to achieve the methods, systems, and software for hardware-component based geometric modifications of computer-modeled part designs described herein. Accordingly, this description is meant to be taken only by way of example, and not to otherwise limit the scope of this invention.

What is claimed is:

1. A non-transitory machine-readable storage medium containing machine-executable instructions for performing a method of providing a natural language interface for a computer-aided design (CAD) system, said machine-executable instructions comprising:

a first set of machine-executable instructions for automatedly receiving, via an input device of a computing device, a user selection through a graphical user interface (GUI) of a particular location of a displayed CAD model;

a second set of machine-executable instructions for automatedly receiving, via the computing device, a user voice input comprising a plurality of words and referring to the particular location;

a third set of machine-executable instructions for automatedly, via the computing device, parsing the user voice input;

a fourth set of machine-executable instructions for automatedly, via the computing device, determining a meaning for the parsed user voice input, the meaning including a reference to the particular location, one or more words associated with one or more program actions, and one or more words associated with one or more command topics, each of the particular location, program actions, and command topics related to a specific item referred to in the voice input;

a fifth set of machine-executable instructions for automatedly, via the computing device and based on the determined meaning, identifying information comprising two or more specifications for the specific item via a CAD context database, wherein the specifications comprise two or more of: a diameter, a length, a depth, a thickness, and a material;

a sixth set of machine-executable instructions for automatedly, via the computing device, assembling a query for additional information based on the meaning, the identified information, and the CAD model;

a seventh set of machine-executable instructions for automatedly, via the computing device, providing the assembled query to a resource provider service;

an eighth set of machine-executable instructions for automatedly, via the computing device, receiving the additional information from the resource provider service, the additional information comprising information regarding at least one CAD model of the specific item to be placed at the particular location selected as a function of the meaning, the identified information, and the CAD model;

a ninth set of machine-executable instructions for automatedly, via the computing device, prompting the user for missing information determined as a function of the additional information based on whether the specific item is compatible with one or more aspects of the CAD model when placed at the particular location;

a tenth set of machine-executable instructions for automatedly, via the computing device, receiving a response from the user to the prompt for missing information;

an eleventh set of machine-executable instructions for automatedly, via the computing device, providing a command to at least one CAD program module based on the additional information and the response from the user to the prompt for missing information; and a twelfth set of machine-executable instructions for automatedly, via the computing device, updating the GUI with respect to the CAD model based on the command.

* * * * *